United States Patent
Mallikarjunaswamy (10) Patent No.: US 6,861,711 B2
(45) Date of Patent: Mar. 1, 2005

(54) THICK GATE OXIDE TRANSISTOR AND ELECTROSTATIC DISCHARGE PROTECTION UTILIZING THICK GATE OXIDE TRANSISTORS

(75) Inventor: Shekar Mallikarjunaswamy, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 10/665,806

(22) Filed: Sep. 19, 2003

(65) Prior Publication Data

US 2004/0129983 A1 Jul. 8, 2004

Related U.S. Application Data

(63) Continuation-in-part of application No. 10/336,202, filed on Jan. 3, 2003.

(51) Int. Cl.$^7$ .............................................. H01L 23/62
(52) U.S. Cl. ........................ 257/360; 257/361; 257/173
(58) Field of Search ................................ 257/360, 361, 257/363, 173, 355, 356, 362

(56) References Cited

U.S. PATENT DOCUMENTS

| | | | |
|---|---|---|---|
| 4,109,274 A | 8/1978 | Belenkov et al. ............. 357/38 |
| 4,605,980 A | 8/1986 | Hartranft et al. ............. 361/56 |
| 4,745,450 A | 5/1988 | Hartranft et al. ........ 357/23.13 |
| 4,807,080 A | 2/1989 | Clark .......................... 361/56 |
| 5,162,888 A | 11/1992 | Co et al. .................... 257/408 |
| 5,374,844 A | 12/1994 | Moyer | |
| 5,424,226 A | 6/1995 | Vo et al. ....................... 437/30 |
| 5,504,444 A | 4/1996 | Neugebauer ................ 327/108 |
| 5,528,188 A | 6/1996 | Au et al. | |
| 5,537,075 A | 7/1996 | Miyazaki .................... 327/566 |
| 5,546,038 A | 8/1996 | Croft | |
| 5,571,737 A | 11/1996 | Sheu et al. ..................... 437/44 |
| 5,578,860 A | 11/1996 | Costa et al. ................. 257/528 |
| 5,602,404 A | 2/1997 | Chen et al. ................. 257/112 |
| 5,631,793 A | 5/1997 | Ker et al. | |
| 5,753,920 A | 5/1998 | Buehler et al. ......... 250/370.06 |
| 5,844,280 A | 12/1998 | Kim ........................... 257/355 |
| 5,870,268 A | 2/1999 | Lin et al. .................... 361/111 |
| 5,959,488 A | 9/1999 | Lin et al. | |
| 6,013,942 A | 1/2000 | Soderbarg et al. | |
| 6,064,109 A | 5/2000 | Blanchard et al. | |
| 6,064,249 A | 5/2000 | Duvvury et al. ............. 327/314 |
| 6,097,235 A | 8/2000 | Hsu et al. | |
| 6,194,764 B1 | 2/2001 | Gossner et al. | |
| 6,225,649 B1 | 5/2001 | Minato | |
| 6,320,232 B1 | 11/2001 | Gossner et al. | |
| 6,414,532 B1 | 7/2002 | Su et al. | |
| 6,437,419 B1 | 8/2002 | Bhalla et al. | |
| 6,469,560 B1 | 10/2002 | Chang et al. | |
| 6,507,471 B2 | 1/2003 | Colclaser et al. | |

FOREIGN PATENT DOCUMENTS

WO  WO 96/30936  10/1996

OTHER PUBLICATIONS

Antinone, Robert J. et al., "Electrical Overstress Protection For Electronic Devices," Noyes Publications, pp. 17–26.

(List continued on next page.)

*Primary Examiner*—Eddie Lee
*Assistant Examiner*—Douglas W. Owens
(74) *Attorney, Agent, or Firm*—Bever, Hoffman & Harms, LLP (57) ABSTRACT

An electrostatic discharge (ESD) protection circuit that includes an transistor with a gate electrode isolated from the semiconductor substrate. The transistor can be an insulated gate bipolar transistor (IGBT) connected between an integrated circuit (IC) pad and ground. The IGBT includes a parasitic thyristor that latches when the voltage at the pad exceeds a threshold level and does not turn off until the charge at the pad is dissipated, thereby preventing electrostatic damage to the IC.

20 Claims, 8 Drawing Sheets

OTHER PUBLICATIONS

Pendharkar, Sameer et al., "SCR–LDMOS—A Novel LDMOS Device With ESD Robustness," 2000 IEEE, pp. 341–344.

Wang, Albert Z.H. et al., "An On–Chip ESD Protection Circuit with Low Trigger Voltage in BiCMOS Technology," IEEE Journal of Solid–State Circuits, vol. 36, No. 1, Jan. 2001, pp. 40–45.

Antinone, Robert J. et al., "Electrical Overstress Protection For Electronic Devices," Park Ridge, N.J., U.S.A.: Noyes Publications, 1986, pp. 17–26.

Iwamuro, N. et al., "Switching Loss Analysis Of Shorted Drain Non Punch–Through And Punch–Through Type IGBTS In Voltage Resonant Circuit," $3^{rd}$ International Symposium on Power Semiconductor Devices and ICS, ISPSD '91, Apr. 22–24, 1991, pp. 220–225.

Simpson, M. R. et al., "Analysis Of The Lateral Insulated Gate Transistor," International Electron Devices meeting, Washington, D.C., Dec. 1–4, 1985, pp. 740–743.

Charvaka Duvvury et al. "Substrate Pump NMOS for ESD Protection Applications," Silicon Technology Development, Texas Instruments, Dallas, Texas, 11 pages.

THICK GATE OXIDE TRANSISTOR AND ELECTROSTATIC DISCHARGE PROTECTION UTILIZING THICK GATE OXIDE TRANSISTORS

CROSS-REFERENCE TO RELATED APPLICATIONS

This application is a continuation-in-part of co-pending U.S. patent application Ser. No. 10/336,202 entitled "Thick Gate Oxide Transistor And Electrostatic Discharge Protection Utilizing Thick Gate Oxide Transistors", filed on Jan. 3, 2003.

BACKGROUND

1. Field of the Invention

This disclosure relates to electrostatic discharge protection of integrated circuits and, in particular, to insulated gate bipolar transistors for electrostatic discharge protection of integrated circuits.

2. Related Art

A problem in designing integrated circuits is dealing with electrostatic discharge (ESD). ESD is caused by static electricity built up by the human body and machines that handle integrated circuits. The static electricity is discharged onto the integrated circuit upon contact or close proximity with the integrated circuit. Static electricity follows any discharge path to alleviate the high electron build-up or deficiency. When an ESD sensitive device, such as an integrated circuit, becomes part of the discharge path, or is brought within the bounds of an electrostatic field, the sensitive integrated circuit can be permanently damaged.

ESD destruction of metal-oxide silicon field-effect transistor (MOSFET) devices occurs when the gate-to-source or gate-to-drain voltage is high enough to arc across the gate dielectric of a transistor device. The arc burns a microscopic hole in the gate oxide, which permanently destroys the MOSFET. Like any capacitor, the gate of a MOSFET must be supplied with a finite charge to reach a particular voltage. Larger MOSFETs have greater capacitance and are therefore less susceptible to ESD than are smaller MOSFETs. Also, immediate failure will not occur until the gate-to-source or gate-to-drain voltage exceeds the dielectric breakdown voltage by two to three times the rated maximum voltage of the gate oxide. The voltages required to induce ESD damage in some transistors can be as high as thousands of volts or as low as 50 volts, depending upon the oxide thickness.

Electrostatic fields can also destroy power MOSFETs by corona discharge. The failure mode is caused by ESD, but the effect is caused by placing the unprotected gate of the MOSFET in a corona discharge path. Corona discharge is caused by a positively or negatively charged surface discharging into small ionic molecules in the air.

When designing an integrated circuit a voltage rating is selected for the pad connecting a node in the circuit. The rating is the maximum voltage that the integrated circuit or pad is designed to withstand without causing damage. ESD protection circuits are generally designed to protect integrated circuits or pads from voltages above the rating for the integrated circuit or its housing.

Automotive applications, for example, demand robust protection (typically 8 kV to 25 kV in the human body model on a system level) against the threat of ESD or other transient pulses such as load dump. In general applications, such as automotive, typically require a high human body model stress level of protection at a minimum of 2,000 volts. Unfortunately, many power MOSFET device designs are unable to meet this requirement.

Automotive applications, for example, demand robust protection (typically 8 kV to 25 kV in the human body model on a system level) against the threat of ESD or other transient pulses, such as load dump. General applications typically require a protection to a minimum of 2,000 volts. Unfortunately, many power MOSFET device designs are unable to meet this requirement.

Therefore, there exists a need to effectively protect circuits from the effects of ESD both cost effectively and efficiently.

SUMMARY OF THE DISCLOSURE

In accordance with the present invention, an electrostatic discharge (ESD) protection circuit that includes a transistor with a gate electrode isolated from the semiconductor substrate is disclosed. In some embodiments, the transistor-based ESD circuit improves the ability to withstand ESD events. In additional embodiments pad designs that take advantage of the ESD circuits are disclosed.

In one embodiment, an electrostatic discharge protection circuit includes a transistor with a gate, an emitter and a collector. The gate of the transistor includes a gate electrode and an insulator material completely isolating the gate electrode from a semiconductor material of the transistor. The ESD protection circuit also includes a collector clamp coupled with a pad and the gate of the transistor, and a resistor coupled with the emitter and the gate of the transistor.

In another embodiment, a structure for electrostatic discharge protection of pads housing integrated circuits includes a pad and a transistor with a gate. The gate includes a gate electrode and an insulator material completely isolating the gate electrode from a semiconductor material of the transistor. The structure also includes a collector clamp coupled with the pad and the gate of the transistor, and a resistor coupled with the emitter and the gate of the transistor.

In a further embodiment, a transistor includes a substrate, a first well region within the substrate, a collector region within the first well region, a second well region within the substrate, first emitter region within the second well region, a second emitter region within the second well region, a third well region within the substrate and between the first and second well regions, a gate electrode, and an insulator material completely separating the gate electrode from the third well region.

BRIEF DESCRIPTION OF THE DRAWINGS

In the present disclosure, like objects that appear in more than one figure are provided with like reference numerals. Further, objects in the figures and relationships in sizes between objects in the figures are not to scale.

DETAILED DESCRIPTION OF THE DRAWINGS

Figure 1:
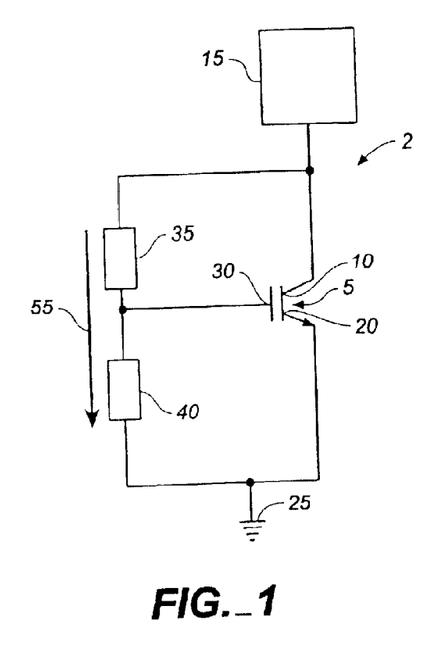
FIG. 1 is simplified schematic diagram of a circuit for electrostatic discharge (ESD) protection, according to an embodiment of the invention.

Referring to FIG. 1, a circuit for electrostatic discharge protection is illustrated. As shown in FIG. 1, a pad 15, along with any integrated circuits coupled to pad 15, are protected by electrostatic discharge (ESD) protection circuit 2. ESD protection circuit 2 includes an insulated gate bipolar transistor (IGBT) 5 that has a collector 10 coupled to pad 15. IGBT 5 also has an emitter 20 that is coupled to a potential 25 that can be, for example, a ground potential, as shown. The ground potential can be a ground bus or a ground pad, as is known in the art. Gate 30 of IGBT 5 is coupled through a collector clamp 35, which comprises one or more diodes, to pad 15. An emitter clamp 40, which also comprises diodes or resistors, is coupled between emitter 20 and gate 30.

When the voltage at pad 15 is below the trigger voltage of collector clamp 35, collector clamp 35 is in a blocking state. As long as collector clamp 35 is not triggered, i.e. does not conduct, emitter 20 and gate 30 are both at potential 25, thus preventing IGBT 5 from conducting. At the onset of an ESD event, when a voltage greater than the trigger voltage of collector clamp 35 (i.e., the total voltage drop across the diodes) appears at pad 15, collector clamp 35 will begin conduction. Conduction by collector clamp 35 causes a current to flow along path 55 through emitter clamp 40.

Once a positive voltage that is greater than the threshold voltage of gate 30 with respect to emitter 20 appears, IGBT 5 will enter its forward conduction state resulting in an increasing the collector to emitter voltage. As the collector to emitter voltage increases, it will reach a level at which the current through IGBT 5 latches a parasitic thyristor that exists in the structure of IGBT 5. Latching of the parasitic thyristor causes a substantial decrease in the collector to emitter voltage. The substantial decrease in the collector to emitter voltage results in dissipation of charge at the pad 15, almost instantaneously. The parasitic thyristor structure of IGBT 5 will continue to conduct until all of the charge at the pad 15 is dissipated.

Collector clamp 35 and emitter clamp 40 can be, for example, zener diodes, diodes, or active clamps, e.g., gate shorted MOSFETs. Also, IGBT 5 has a gate electrode that is completely isolated from the semiconductor material of IGBT 5 by an insulator material. This is a thick gate oxide that allows emitter clamp 40 to be a resistor without the need for an additional emitter clamp in parallel to emitter clamp 40. Therefore, a single conduction path between gate 30 and emitter 20 can be used, thus reducing components and surface area.

Figure 10:
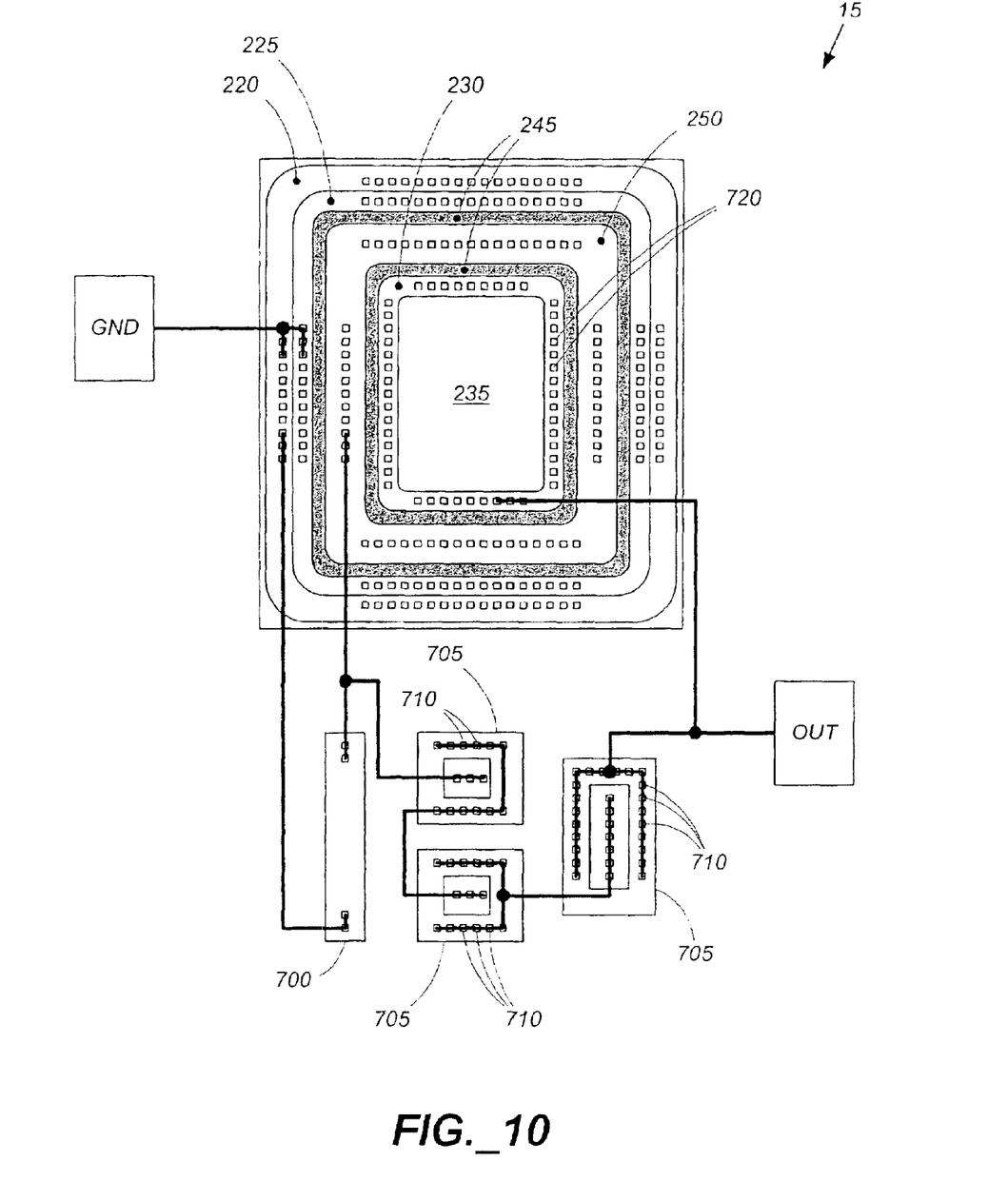
FIG. 10 is a layout of a pad with an electrostatic discharge protection circuit fabricated upon it, according to an embodiment of the invention.

In some embodiments, ESD protection circuit 2 is fabricated upon pad 15. FIG. 10 illustrates embodiments of an ESD protection circuit formed on a pad.

Embodiments of ESD protection circuits and IGBTs capable of being used with the ESD circuits described herein are also depicted and described in co-owned and co-pending U.S. patent application Ser. No. 10/336,129, entitled "Insulated Gate Bipolar Transistor And Electrostatic Discharge Cell Protection Utilizing Insulated Gate Bipolar Transistors."

Figure 2:
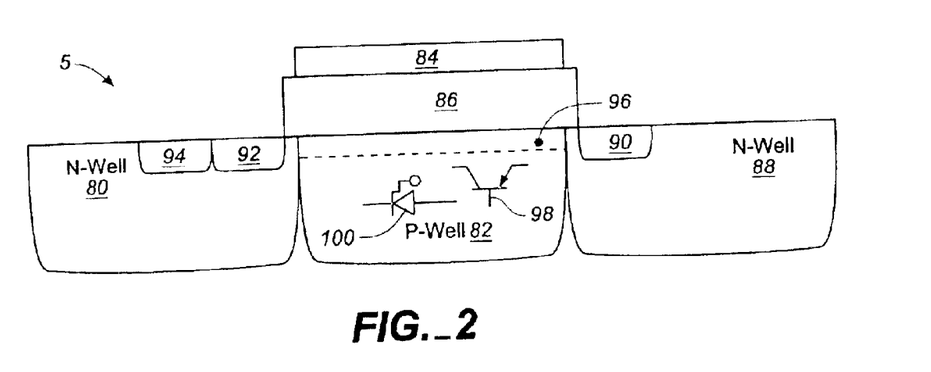
FIG. 2 is a simplified cross-sectional view of a lateral insulated gate bipolar transistor for use in a circuit for ESD protection, according to an embodiment of the invention.

Referring to FIG. 2, a simplified diagram of an embodiment of lateral insulated gate bipolar transistor 5 is illustrated. In FIG. 2, n-well region 80 forms a junction with a p-well region 82, which is isolated from gate electrode 84 by a field oxide 86. P-well 82 further forms a junction with n-well 88. A collector region 90, which is a p+-type material, is formed in n-well 88. A first emitter region 92, which is an n+-type material, and a second emitter region 94, which is a p+-type material, are formed in n-well 80.

When a voltage is applied at gate electrode 84 at gate 30 that exceeds the threshold voltage of field oxide 86 of IGBT 5, an inversion channel 96 is formed on the surface of p-well 82 and electrons flow from first emitter region 92 through inversion channel 96 into n-well 88. The electrons provide base current for pnp-transistor 98 formed between second collector region 90 (transistor emitter), n-well 88 (transistor base) and p-well 82 (transistor collector). An isolation region (not shown) can be utilized to connect the second emitter region 94 and p-well 82.

When collector region 90 has a voltage greater by about 0.7 volts than n-well 88, collector region 90 gets forward biased and begins to inject holes into n-well 88, which are collected by p-well 82. The holes collected by p-well 82 forward bias the junction between p-well 82 and n-well 80/first emitter region 92, which causes parasitic thyristor 100 to latch up. Parasitic thyristor 100 is formed from collector region 90, n-well 88, p-well 82, and n-well 80/first emitter region 92. At latch up, parasitic thyristor 100 will not respond to changes in the current or voltage at gate 30 of IGBT 5. Current will flow through parasitic thyristor 100 until the charge at pad 15 is dissipated so that the voltage at the pad with respect to ground is below the trigger voltage for collector clamp 35 (FIG. 1).

Triggering a parasitic thyristor in the structure of an IGBT to dissipate ESD induced voltages provides several advantages over MOSFET based ESD protection schemes. One advantage is improved power dissipation by ESD protection circuit 2 of FIG. 1. The improved power dissipation also increases the useful life of ESD protection circuit 2.

The IGBT sustaining voltage before the on-set of parasitic thyristor turn-on reduces with increasing gate bias. That is the higher the voltage at gate 30 of FIG. 1 with respect to emitter 20, the larger the amount of holes that are collected by p-well 82 from collector region 90 through n-well 88. The larger the amount of holes that are collected, the greater the forward bias the junction between first emitter region 92 and second emitter region 94, which causes parasitic thyristor 100 to latch up.

Referring again to FIG. 1, when collector clamp 35 consists of diodes, the trigger voltage would be the sum of the reverse breakdown voltages of the one or more diodes that comprise collector clamp 35. By changing the trigger voltage of collector clamp 35, the voltage at which IGBT 5 begins conduction is altered, allowing a circuit designer to change the rating of pad 15 without having to redesign or change IGBT 5. This results in a substantial cost saving and also in greater design flexibility, since IGBT 5 can be used regardless of the rating of the pad. In some embodiments, the breakdown voltage is altered by changing the number of diodes that make up collector clamp 35, without having to resize the diodes or other circuit components.

Figure 3:
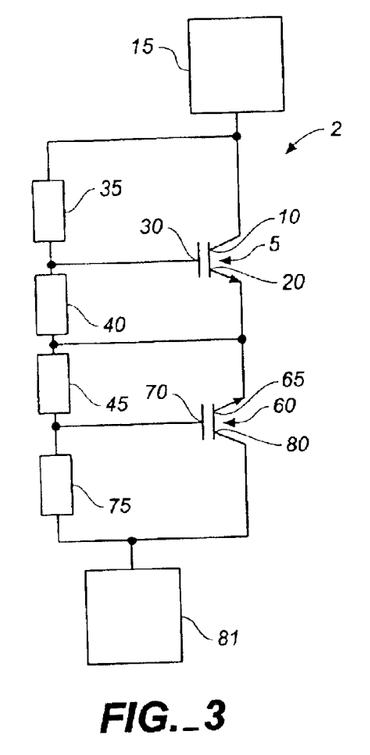
FIG. 3 is a simplified schematic diagram of circuit for ESD protection, according to another embodiment of the invention.

Referring to FIG. 3, another circuit for electrostatic discharge protection is illustrated. In FIG. 3, another IGBT 60 is added to ESD protection circuit 2. An emitter 65 of IGBT 60 is coupled to emitter 20 of IGBT 5. The gate 70 of IGBT 60 is coupled to its emitter 65 through emitter clamp 45. Collector 80 of IGBT 60 is coupled to pad 81. Another collector clamp 75 couples gate 70 of IGBT 60 to pad 81. IGBT 5 is coupled essentially the same way as illustrated in FIG. 1.

The circuit in FIG. 3 is especially advantageous in handling bi-directional ESD events, where a voltage at pad 81 is greater than a potential at pad 15, and vice versa. This is because IGBT 5 responds to positive ESD events, while IGBT 60 responds to negative ESD events. Further, both collector clamps 35 and 75 can be optimized either together or separately to allow flexibility in the ESD rating of pad 15 and pad 81.

It should be noted that the ESD protection circuits of FIGS. 1 and 3 could be integrated circuits for ease of use and manufacture onto pad 15.

The circuits described in FIGS. 1 and 3 can be utilized regardless of the desired voltage rating of pad 15 without changing IGBT 5 or IGBT 60. IGBT 5 can, for example, withstand 5,000 volts during an ESD event, or any other amount. However, the circuit can operate for a pad 15 rated to almost any value, simply by changing the trigger voltage of collector clamp 35 or collector clamp 75 to the desired rating. In the case where either collector clamp 35 or collector clamp 75 comprises diodes, the trigger voltage can be changed by adding or removing diodes that constitute collector clamp 35 or collector clamp 75. This greatly increases the utility and cost effectiveness of the ESD protection circuits illustrated in FIGS. 1 and 3 over conventional ESD protection designs.

Figure 4A:
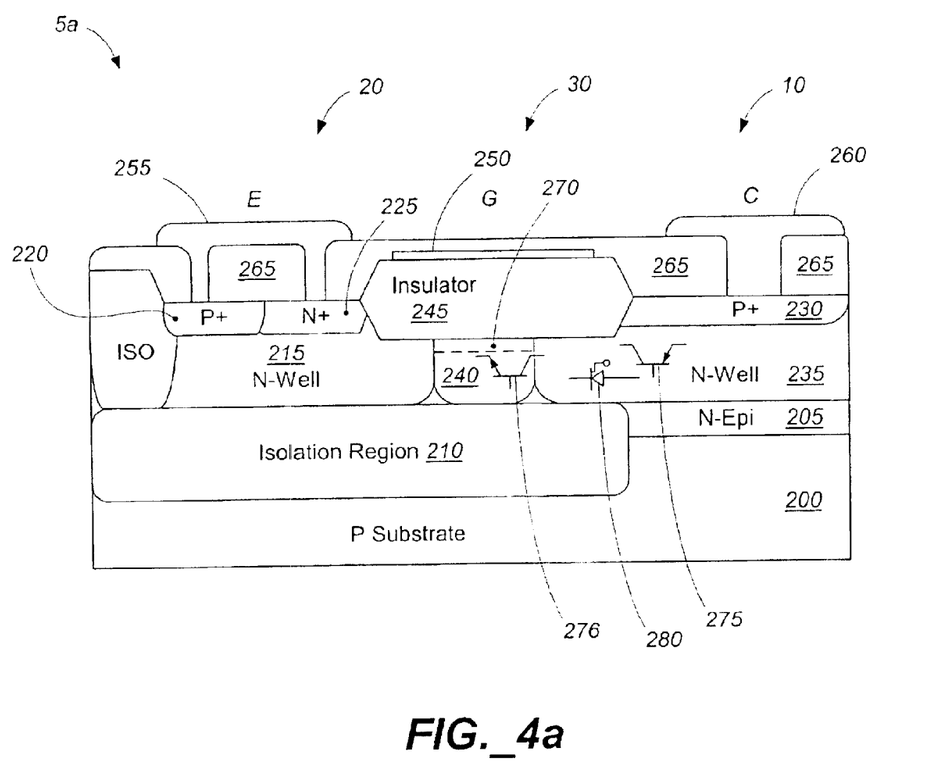
FIG. 4a is a cross-sectional view of an embodiment of a lateral insulated gate bipolar transistor for use in an ESD protection circuit, according to an embodiment of the invention.

Referring to FIG. 4a, a cross-sectional view of a lateral insulated gate bipolar transistor 5a for electrostatic discharge protection is illustrated. In FIG. 4a, IGBT 5a comprises a p-type substrate 200. An epitaxial region 205, which is n-type, is grown over substrate 200. An isolation region 210, which is an up-diffused p-type region, is also formed in substrate 200. An n-well 215 is formed within substrate 200. A first emitter region 220, which may be p+-type (heavily doped), and a second emitter region 225, which may be n+-type (heavily doped), are formed within n-well 215. A collector region 230, which may be p+-type, is formed in an n-well 235 that is formed in substrate 200. A p-well 240 is formed in substrate 200 above which an insulator material 245 is formed. In some embodiments, insulator material 245 is a field oxide having a depth of approximately 0.7 to 1 micron.

A gate electrode 250, which in one embodiment is comprised of a polycrystalline silicon material, is completely isolated from all of the layers diffused and formed in substrate 200 by insulator material 245. An emitter electrode 255 is in common contact with both first emitter region 220 and second emitter region 225. A collector electrode 260 is in contact with collector region 230. An insulation film 265 formed of a chemically vapor deposited film, such as a boron phosphorous silicate glass (BPSG) or other insulation, is disposed over IGBT 5 for planarization and insulation of the surface.

As is known in the art, an IGBT includes parasitic pnp and npn transistors, with the base of the pnp transistor forming the collector of the npn transistor, and the base of the npn transistor forming the collector of the pnp transistor to create a parasitic thyristor. This back-to-back transistor configuration is sometimes referred to as a "pseudo-Darlington" configuration. The emitter of the pnp transistor then forms the collector of the IGBT, while the emitter of the npn transistor forms the emitter of the IGBT. The base of the npn transistor is also coupled to the emitter of the IGBT.

Thus, in IGBT 5a shown in FIG. 4a, a parasitic pnp transistor 275 is formed by collector region 230 (pnp emitter), n-well 235 (pnp base), and p-well 240 (pnp collector), while a parasitic npn transistor 276 is formed by n-well 235 (npn collector), p-well 240 (npn base), and n-well 215/second emitter region 225 (npn emitter). As described above, the emitter of pnp transistor 275 (i.e., collector region 230) forms the collector of IGBT 5a, while the emitter of npn transistor 276 (i.e., second emitter region 225) forms the emitter of IGBT 5a. Note that electrode 255 ties the emitter of npn transistor 276 to the base of npn transistor 276 (i.e., p-well 240) via first emitter region 220 and p-type isolation regions ISO and 210. A parasitic thyristor 280 is therefore formed by second emitter region 225/n-well region 215 (thyristor cathode), p-well 240 (npn-transistor base), n-well 235 (pnp-transistor base), and collector region 230 (thyristor anode).

Operation of IGBT 5a of FIG. 4a will now be described. Once a voltage, higher than the threshold voltage and positive with respect to a potential of emitter electrode 255, is applied to gate electrode 250 an inversion layer 270 is created. The inversion layer 270 is formed on the surface of p-well 240 between second emitter region 225 and n-well 235. Electrons then flow from second emitter region 225 through p-well 240 into n-well 235 through inversion layer 270. The electron flow into n-well 235 functions as a base current for pnp-transistor 275.

Once collector region 230 reaches a voltage greater than about 0.7 volts above that of n-well 235, collector region 230 begins to inject holes into n-well 235 that are collected by p-well 240, which cause conduction by pnp-transistor 275. The difference of about 0.7 volts for beginning hole injection can be altered by changing the doping of collector region 230 and n-well 235.

When the holes collected in p-well 240 forward bias p-well 240 with respect to n-well 215, npn transistor 276 is turned on. At that point, since both npn transistor 276 and pnp transistor 275 are both on, parasitic thyristor 280 latches on and conducts all of the current flowing through IGBT 5a. Further, parasitic thyristor 280 will not cease conduction until all of the charge at collector electrode 260 is dissipated. The latching of parasitic thyristor 280 varies based upon the resistance of isolation region 210, which is a function of the volume of the isolation region multiplied by its resistivity. Therefore, by changing the dimensions of isolation region 210 the latching of parasitic thyristor 280 can be altered.

Triggering parasitic thyristor 280 in IGBT 5a runs counter to the accepted and desired use of IGBTs. This is because, as described above, parasitic thyristor 280 will not cease conduction until the charge at collector electrode 260 is dissipated. The result is that, once parasitic thyristor 280 is latched up, the IGBT cannot be controlled by its bias circuitry and cannot operate in its linear amplification or switching region.

It should be noted that isolation region 210 is used to reduce the surface electric fields (RESURF) between n-well 235 and p-well 240. Further, by varying the depth of isolation region 210 the collector to emitter breakdown voltage, which is the forward blocking voltage of IGBT 5a of IGBT 5a, can be varied.

Figure 4B:
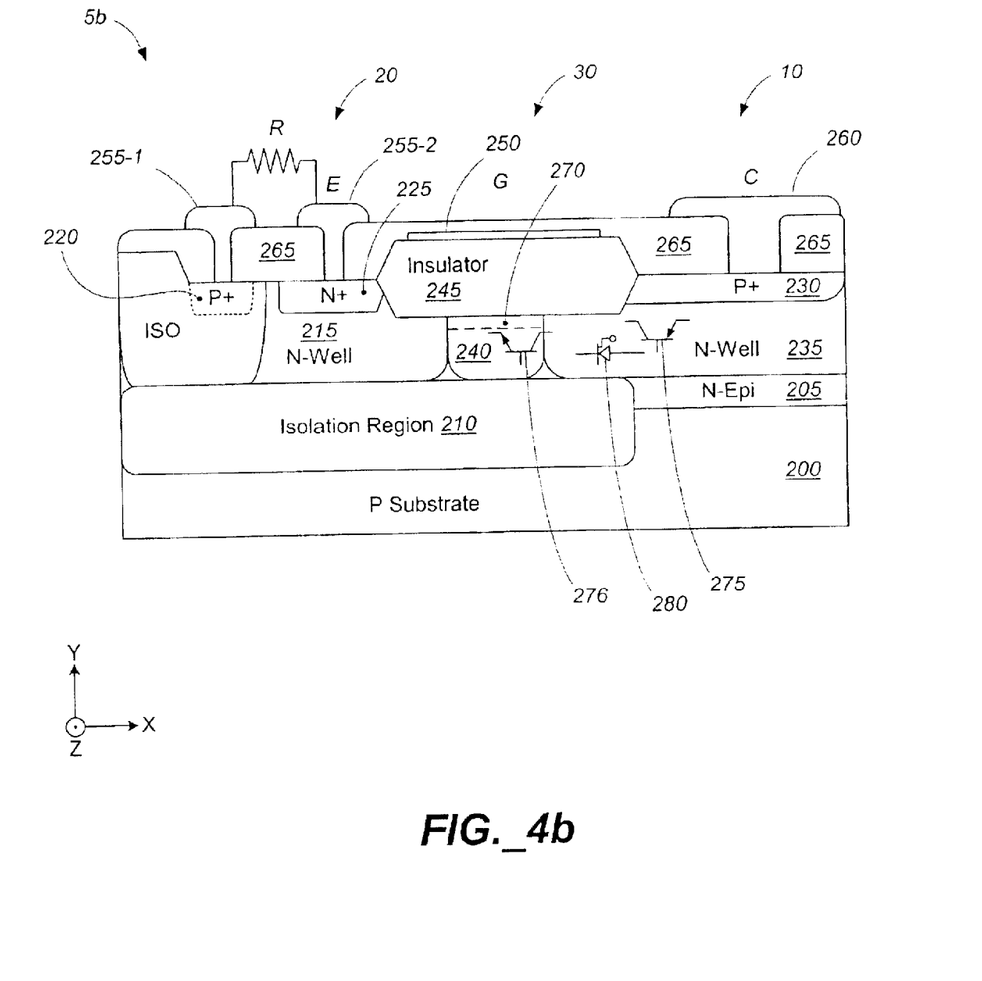
FIG. 4b is a cross-sectional view of a lateral insulated gate bipolar transistor for use in an ESD protection circuit, according to another embodiment of the invention

Referring to FIG. 4b, a cross-sectional view of a lateral IGBT 5b for electrostatic discharge protection is illustrated according to another embodiment of the invention. IGBT 5b is substantially similar to IGBT 5a shown in FIG. 4a, except that first emitter region 220 and second emitter region 225 have separate emitter electrodes 255-1 and 255-2, respectively. First emitter region 220 and second emitter 225 are formed completely within isolation region ISO and n-well 215, respectively, and so are not in direct contact with one another. Meanwhile, p-well 240 is coupled to n-well 215 by a resistor R.

According to an embodiment of the invention, resistor R can comprise a discrete resistor structure that connects emitter electrodes 255-1 and 255-2. According to another embodiment of the invention, resistor R can comprise an inherent resistance within isolation regions ISO and/or 210, created by moving P+ first emitter region 220 away from N+ second emitter region 225. According to an embodiment of the invention, first emitter region 220 can be located remotely (i.e., in a non-adjacent position to second emitter region 225), thereby increase the length of the current path, and hence the resistance, through isolation regions ISO and 210. Electrodes 255-1 and 255-2 could then be formed as a single (long) electrode. For example, first emitter region 220 could be placed in an "off-axis" location—i.e., a location offset from the other elements of IGBT 5b (such as second emitter region 220, collector region 230 and p-well 240) in the z-axis direction (i.e. parallel to the plane of the wafer (substrate 200) and perpendicular to the carrier flow direction in channel 270).

Lateral IGBT 5b operates in a manner substantially similar to that described with respect to lateral IGBT 5a shown in FIG. 4a, except that incorporating resistor R, the response of parasitic thyristor 280 can be improved. Specifically, resistor R reduces the current required to create the necessary forward bias between p-well 240 and n-well 215/second emitter 225 that turns on parasitic npn transistor 276 and latches parasitic thyristor 280. The larger the resistance of resistor R, the smaller this initial current need be, and the more rapidly parasitic thyristor 280 can latch up in response to an overvoltage condition.

Note that, P+ first emitter region 220 is depicted using a dotted line, since according to another embodiment of the invention, first emitter region 220 can be eliminated, and electrode 255-1 can be placed in direct contact with isolation region ISO. Second emitter region 225 would then be coupled to p-well 240 via electrode 255-2, resistor R, electrode 255-1, isolation region ISO, and isolation region 210. Isolation regions ISO and 210 are the same conductivity type as p-well 240, and therefore provide the necessary conductive path to p-well 240.

Figure 5:
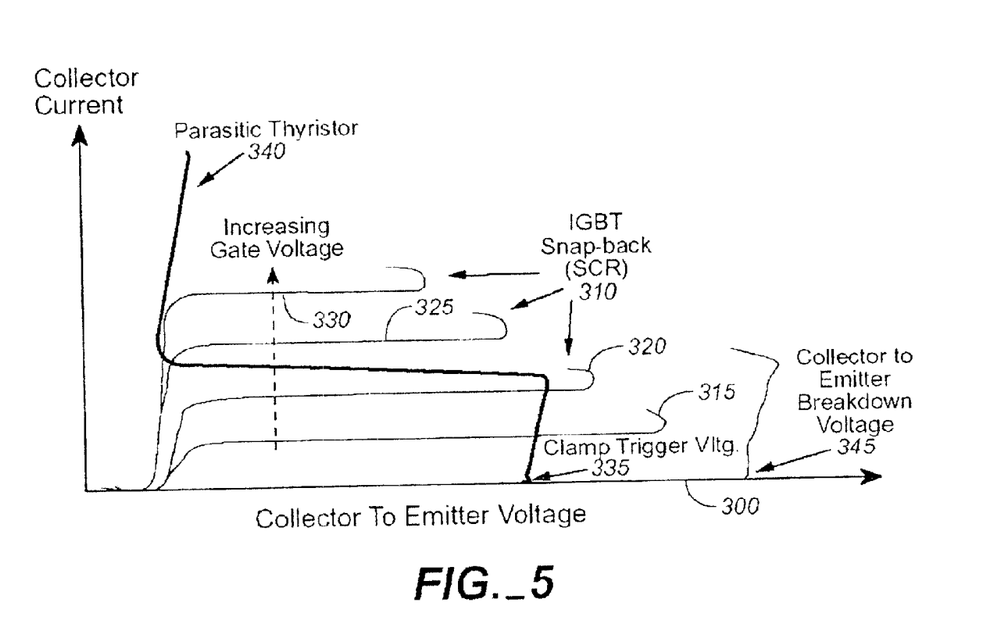
FIG. 5 is a graph of the current-voltage characteristics of a collector of the lateral insulated gate bipolar transistor illustrated in FIG. 4, according to another embodiment of the invention.

Referring to FIG. 5, a graph of the current-voltage characteristics of a collector of the lateral insulated gate bipolar transistor 5a illustrated in FIG. 4a is illustrated. In FIG. 5, as collector to emitter voltage 300 increases, it will snap-back at 310 when parasitic thyristor 280 latches up. Also, as the voltage at gate 30 is increased the latch-up voltage of the parasitic thyristor 280 decreases, as shown by gate voltage levels 315, 320, 325, and 330.

Additionally, FIG. 5 illustrates the advantage of the use of an IGBT for ESD protection by showing operation of parasitic thyristor 280. Specifically, parasitic thyristor 280 latches up at a voltage that is a sum of the clamp trigger voltage 335 and the voltage on the gate required to forward bias the junction between n-well 215 and p-well 240. This can be altered by changing the resistance of isolation region 210, and the thickness of insulator material 245 for a lower gate voltage. Upon latching up, the parasitic thyristor 280 begins conducting thereby reducing the charge at pad 15 until the charge at pad 15 is dissipated. The operation of parasitic thyristor 280 is shown by curve 340.

The collector to emitter breakdown voltage 345 is the voltage at which IGBT 5 is not able to function in a forward blocking state. In ESD protection circuit 2, the breakdown voltage of collector clamp 35 must be set to a voltage less than the difference between collector to emitter breakdown voltage 345 and the gate voltage of IGBT 5 required to trigger parasitic thyristor 280.

Figure 6:
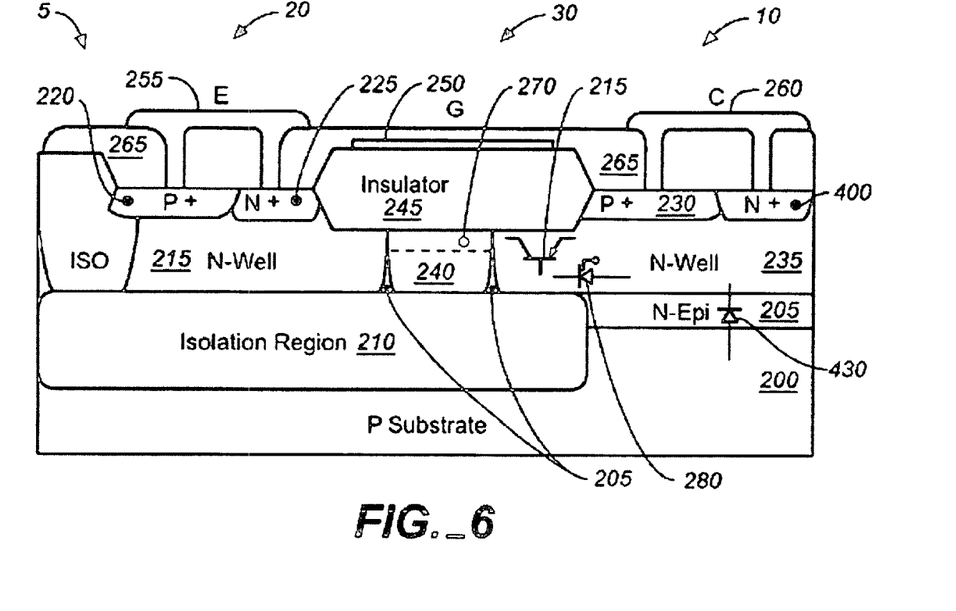
FIG. 6 is a cross-sectional view of a lateral insulated gate bipolar transistor for use in an ESD protection circuit, according to another embodiment of the invention.

Referring to FIG. 6, a cross-sectional view of another embodiment of a lateral insulated gate bipolar transistor for electrostatic discharge protection is illustrated. In FIG. 6, a second collector region 400, which may be n+-type, is added forming a junction with the collector region 230. The second collector region 400 acts as a short between collector electrode 260 and n-well 235 during conduction by IGBT 5. Thus a diode 430 is created between substrate 200 and n-well 235.

Figure 7:
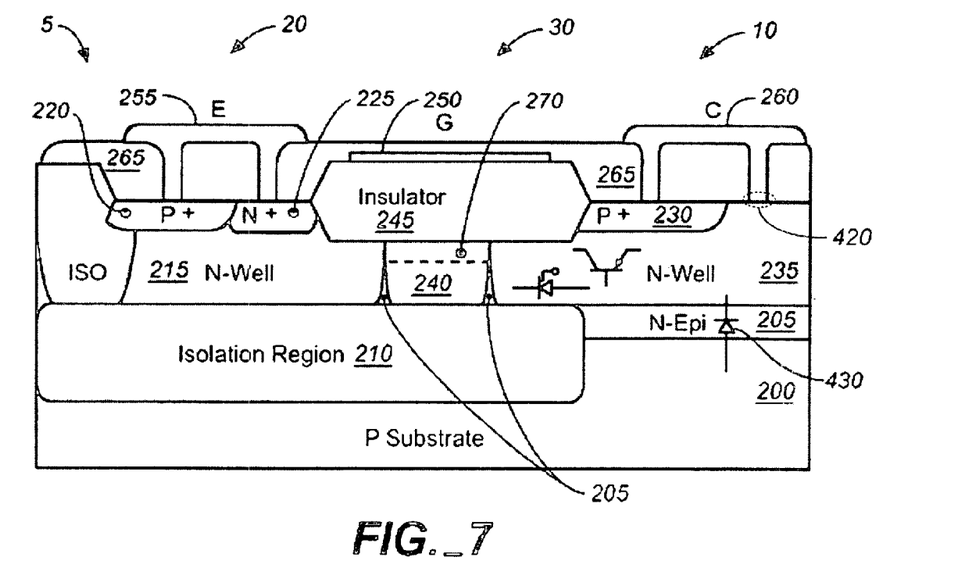
FIG. 7 is a cross-sectional view of a lateral insulated gate bipolar transistor for use in an ESD protection circuit, according to another embodiment of the invention.

Referring to FIG. 7, a cross-sectional view of another embodiment of a lateral insulated gate bipolar transistor for electrostatic discharge protection is illustrated. In the embodiment shown in FIG. 7, a contact 420 is then added to collector electrode 260. The contact 420, which is a Schottky contact, acts as a short between collector electrode 260 and n-well 235. The short between collector electrode 260 and n-well 235 improves negative ESD event dissipation and allows for conduction by IGBT 5 at a lower voltage. Further, metal contact 420 improves the homogenous turn on of parasitic thyristor 280.

Alternatively, collector electrode 260 can itself be completely or partially formed of a metallic material to form either an ohmic or a Schottky contact to collector region 230.

An advantage of the lateral IGBTs in FIGS. 6 and 7 over that of FIG. 4 is the reaction of the IGBT to negative ESD events, where the charge at the pad is negative with respect to potential 25. Substrate 200 and n-well 235 form a diode 430 between substrate 200 and collector electrode 260. Diode 430 is formed due to the short between n-well 235 and collector electrode 260. Diode 430 conducts current induced by negative ESD events from pad 15 to substrate 200. Diode 430 allows IGBT 5 to dissipate voltages induced by negative ESD events. The use of the structures of FIGS. 6 and 7 improves the response to negative ESD events versus that of FIG. 4.

Figure 8:
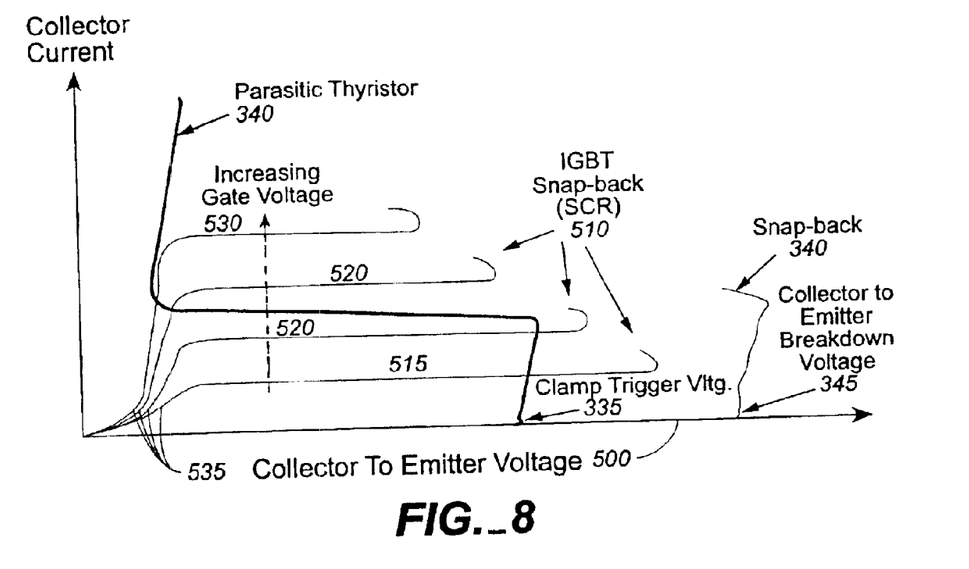
FIG. 8 is a graph of the current-voltage characteristics of a collector of the lateral insulated gate bipolar transistors illustrated in FIGS. 6 and 7.

FIG. 8 is a graph of the current-voltage characteristics of a collector of a lateral insulated gate bipolar transistor as illustrated in FIGS. 6 and 7. As the collector to emitter voltage 500 increases, it will snap-back at 510 as parasitic thyristor 280 latches-up as described with respect to FIG. 5. Also, as the voltage on gate 30 is increased the latch-up voltage of the parasitic thyristor decreases as shown by gate voltage levels 515, 520 and 530, as described with respect to FIG. 5.

A feature of the IGBT structures of FIGS. 6 and 7 is collector conduction prior to the turn on of pnp-transistor 275, as shown by early current flows 535.

Although exemplary doping characteristics are discussed with respect to FIGS. 4, 6 and 7, other doping characteristics, including those that result in complimentary structures to those disclosed, are possible and can be used in the circuits of FIGS. 1 and 3.

Further, additional variations may be made to IGBT structures discussed with respect to FIGS. 4, 6, and 7. For example, a p-well or p-body region, or their complementary doping in a complementary IGBT, that is self-aligned on the emitter side with gate electrode 250 may be included.

Figure 9:
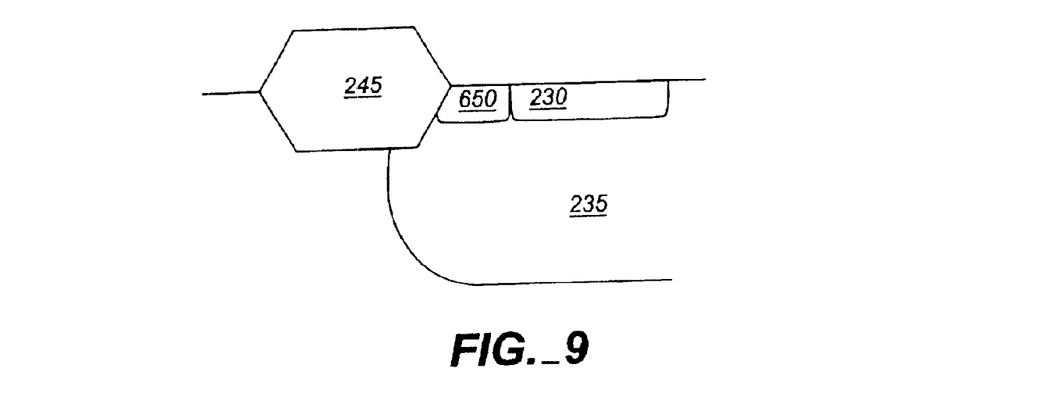
FIG. 9 is a cross-sectional detail view of a structure for leakage current reduction in a lateral insulated gate bipolar transistor, according to an embodiment of the invention.

Referring to FIG. 9, a cross-sectional view of a lateral insulated gate bipolar transistor with leakage current reduction is illustrated. The IGBTs shown in FIGS. 4a, 4b, 6, and 7 each have a small leakage current on the surface of pnp-transistor 275 due to punch through or surface charges. This leakage current, which is inherent to the structure of an IGBT, can cause erroneous latching of parasitic thyristor 280 due to the leakage current that occurs prior to triggering of collector clamp 35.

Inserting a punch through reduction region 650 that forms a butting junction with collector region 230 on one side and a butting junction with insulator material 245 on the other side can substantially reduce or eliminate this leakage current. Punch through reduction region 650 should be of a complementary conductivity type to collector region 230— e.g., for a p-type collector region 230 as shown in FIG. 9, punch through reduction region 650 would be an n-type structure. The punch through reduction region 650 can be relatively small in width; in one embodiment the width is no more than two (2) microns. The use of a punch through reduction region 650 reduces inaccurate and premature latching of parasitic thyristor 280.

Figure 9A:
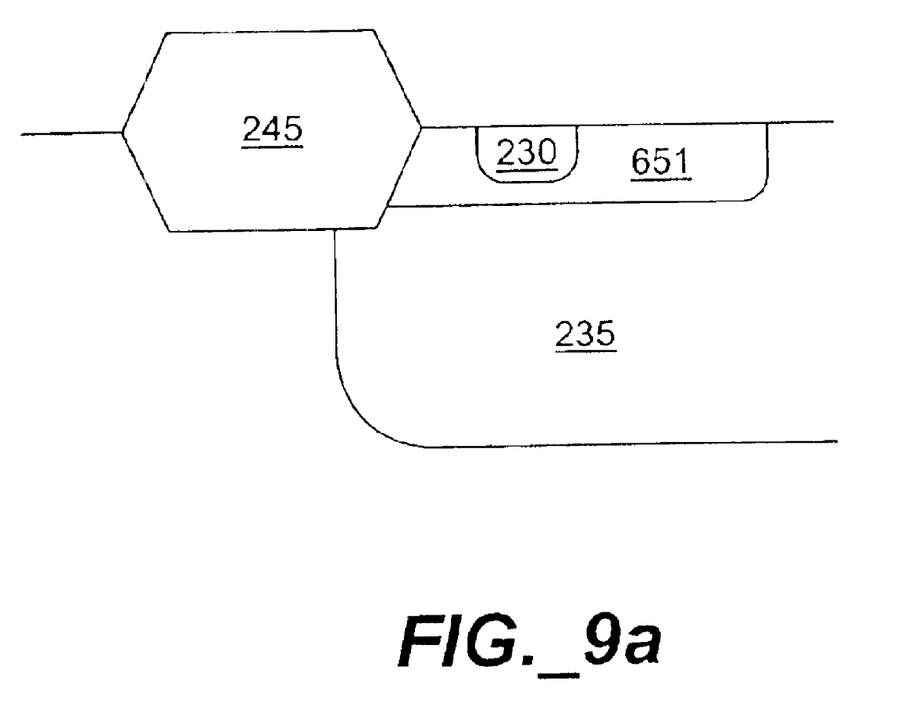
FIG. 9a is a cross-sectional detail view of a structure for leakage current reduction in a lateral insulated gate bipolar transistor, according to another embodiment of the invention.

Alternatively, to reduce the leakage current, a buffer region 651 can be added to the n-well 235, as shown in FIG. 9a. Buffer region 651 forms a butting junction with insulator material 245, and collector region 230 is formed completely within buffer region 651. The buffer region 651 can be formed by heavily doping the portion of the n-well 235 enclosing the collector region 230.

Referring to FIG. 10, a pad 15 with an electrostatic discharge protection circuit fabricated upon it is illustrated. Pad 15 has a trace 700 that forms a resistor as emitter clamp 45 45 and diffusions 705 that form collector clamp 35, which is made up of a number of diodes. Diffusions 705 have a number of contacts 710 to pad 15.

Gate electrode 250, which has rounded corners as depicted, overlies insulator material 245 and has a similar shape to gate electrode 250. A number of contacts 720 provide bonding to pad 15. Field oxide 245 is below gate electrode 250.

Collector region 230 is diffused along a periphery of n-well 235 and also has a number or contacts 720. Likewise, emitter regions 220 and 225 surround insulator material 245 in a similar oval configuration, and are grounded via ground pad GND.

By fabricating IGBT 5 on a pad the ruggedness of IGBT 5 is increased due to the charge distribution on the device. Further, the response time of IGBT 5 improves by fabricating it on pad 15, thereby reducing the potential for damage to integrated circuits bonded to pad 15. In another embodiment IGBT 5 is fabricated on at least two sides of one of the surfaces of pad 15.

While FIG. 10 depicts IGBT 5 in a substantially oval configuration, other configurations of IGBT can be used. For example, racetrack or configurations having multiple fingers can be used. Further, IGBT 5 can be fabricated on two or three sides of a surface of pad 15.

It should be noted that while IGBT 5 is illustrated as a lateral IGBT in FIGS. 4, 6, and 7, a vertical IGBT can also be utilized based upon the principles and utilizing the same region constituents as described herein. Further, it would be advantageous to use a vertical IGBT in an integrated ESD protection circuit.

It should be noted that while FIGS. 1–10 illustrate an IGBT, a metal oxide semiconductor field effect transistor (MOSFET) can be utilized in place of an IGBT. In such instances the structure would be altered, for example, by removing first emitter region 220.

The detailed description provided above is merely illustrative, and is not intended to be limiting. While embodiments, applications and advantages of the present inventions have been depicted and described, there are many more embodiments, applications and advantages possible without deviating from the spirit of the inventive concepts described and depicted herein. The invention should only be restricted in accordance with the spirit of the claims appended hereto and is not restricted by the embodiments, specification or drawings.

What is claimed is:

1. An electrostatic discharge (ESD) protection circuit comprising:
   a resistor; and
   an insulated gate bipolar transistor (IGBT) comprising:
   a first well region, wherein the IGBT collector is within the first well region;
   a second well region, wherein the IGBT emitter is within the second well region;
   a third well region between the first well region and the second well region, the third well region being coupled to the second well region by the resistor;
   an insulating region between the IGBT collector and the IGBT emitter and over the third well region; and
   a gate electrode over the third well region, the gate electrode being completely separated from the third well region by the insulating region.

2. The ESD protection circuit of claim 1, wherein the IGBT further comprises:
   an emitter electrode in contact with the IGBT emitter; and
   at least one isolation structure connecting the third well region and the emitter electrode, wherein the at least one isolation structure and the third well region have a first conductivity type, and wherein the resistor comprises the at least one isolation structure.

3. The ESD protection circuit of claim 2, wherein the at least one isolation structure includes a heavily doped portion having the first conductivity type, the heavily doped portion being in contact with the emitter electrode, and
   wherein the heavily doped portion is located remotely from the IGBT emitter.

4. The ESD protection circuit of claim 3, wherein the first well region, the second well region, and the IGBT emitter have n-type conductivity, and
   wherein the IGBT collector, the third well region, and the at least one isolation structure have p-type conductivity.

5. The ESD protection circuit of claim 1, wherein the IGBT further comprises a punch through reduction region forming a first butting junction with the insulating region and a second butting junction with the IGBT collector, wherein the IGBT collector has the first conductivity type and the punch through reduction region has a second conductivity type.

6. The ESD protection circuit of claim 1, wherein the first well region comprises a heavily doped buffer region that forms a butting junction with the insulating region, and wherein the IGBT collector is formed within the heavily doped buffer region.

7. The ESD protection circuit of claim 1, wherein the IGBT further comprises:
a first emitter electrode in contact with the IGBT emitter;
a second emitter electrode connected to the first emitter electrode by the resistor; and
at least one isolation structure connecting the third well region and the second emitter electrode, wherein the at least one isolation structure and the third well region have a first conductivity type.

8. The ESD protection circuit of claim 7, wherein the at least one isolation structure includes a first heavily doped portion, the first heavily doped portion having the first conductivity type, and the first heavily doped portion being in contact with the second emitter electrode.

9. The ESD protection circuit of claim 1, wherein the insulating region is a field oxide.

10. An integrated circuit (IC) comprising:
a contact pad; and
a transistor coupled between the contact pad and a ground potential, wherein the transistor comprises:
a collector electrode;
a first emitter electrode;
a parasitic pnp transistor; and
a parasitic npn transistor coupled to the parasitic pnp transistor to form a parasitic thyristor between the collector electrode and the first emitter electrode;
a second emitter electrode coupled to a base of the parasitic npn transistor; and
a resistor connecting a base of the parasitic npn transistor to an emitter of the parasitic npn transistor.

11. The IC of claim 10, wherein the parasitic pnp transistor comprises a p-well, a first n-well forming a first butting junction with the p-well, and a p-type collector region formed in the first n-well, the p-type collector region being in contact with the collector electrode, and
wherein the parasitic npn transistor comprises the first n-well, the p-well, and a second n-well forming a second butting junction with the p-well, the second n-well including a heavily doped n-type emitter region in contact with the first emitter electrode.

12. The IC of claim 11, wherein the transistor further comprises:
an insulator region in contact with the p-well and between the p-type collector region and the heavily doped n-type emitter region; and
a gate electrode above the p-well, wherein the gate electrode is separated from the p-well by the insulator region.

13. The IC of claim 12, wherein the second emitter electrode is connected to the p-well by at least one isolation structure, wherein each at least one isolation structure is a p-type structure.

14. The IC of claim 12, wherein the first n-well comprises a heavily doped n-type punch through reduction region forming a first butting junction with the insulator region and a second butting junction with the p-type collector region.

15. The IC of claim 12, wherein the first n-well comprises a heavily doped n-type buffer region that forms a butting junction with the insulator region, and wherein the p-type collector region is formed within the heavily doped n-type buffer region.

16. The IC of claim 12, wherein the contact pad is connected to the gate electrode by a collector clamp, the collector clamp comprising one or more diodes.

17. The IC of claim 12, wherein the transistor is formed on the contact pad.

18. The IC of claim 12, wherein the insulator region is a field oxide.

19. The IC claim 13, wherein the at least one isolation structure includes a heavily doped p-type region in contact with the second emitter electrode.

20. The IC of claim 19, wherein the heavily doped p-type region is located remotely from the heavily doped n-type emitter region, and
wherein the first emitter electrode is directly connected to the second emitter electrode.

* * * * *

UNITED STATES PATENT AND TRADEMARK OFFICE
CERTIFICATE OF CORRECTION

PATENT NO.      : 6,861,711 B2
DATED           : March 1, 2005
INVENTOR(S)     : Shekar Mallikarjunaswamy It is certified that error appears in the above-identified patent and that said Letters Patent is hereby corrected as shown below:

<u>Title page,</u>
Item [57], ABSTRACT,
Line 2, replace "an" with -- a --.

<u>Column 1, line 62 thru Column 2, line 2,</u>
Delete paragraph beginning with "Automotive" and ending with "requirement.".

<u>Column 2,</u>
Line 52, insert -- a -- before "simplified".

<u>Column 3,</u>
Line 57, delete "an".

<u>Column 7,</u>
Line 11, delete "of IGBT 5$a$".

<u>Column 9,</u>
Line 50, delete "45" (second occurrence).

<u>Column 12,</u>
Line 37, insert -- of -- before "claim".

Signed and Sealed this

Seventeenth Day of January, 2006

JON W. DUDAS
*Director of the United States Patent and Trademark Office*